(12) United States Patent
Oh

(10) Patent No.: US 8,766,668 B2
(45) Date of Patent: Jul. 1, 2014

(54) INTEGRATED CIRCUIT CHIP

(75) Inventor: Seung-Min Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/606,305

(22) Filed: Sep. 7, 2012

(65) Prior Publication Data

US 2013/0099830 A1  Apr. 25, 2013

(30) Foreign Application Priority Data

Oct. 21, 2011  (KR) .................. 10-2011-0107954

(51) Int. Cl.
| H03K 19/094 | (2006.01) |
| H03K 19/20 | (2006.01) |
| H03K 3/00 | (2006.01) |
| H03B 1/00 | (2006.01) |

(52) U.S. Cl.
USPC .............................. 326/87; 326/115; 327/108

(58) Field of Classification Search
USPC .............. 326/68, 82, 83, 86, 87, 93, 95, 112, 326/115; 327/108, 109; 710/14
See application file for complete search history.

(56) References Cited

U.S. PATENT DOCUMENTS

| 5,929,655 | A * | 7/1999 | Roe et al. ........................ 326/82 |
| 6,243,776 | B1 * | 6/2001 | Lattimore et al. ............ 710/104 |
| 6,472,904 | B2 * | 10/2002 | Andrews et al. ................. 326/38 |
| 6,480,026 | B2 * | 11/2002 | Andrews et al. ................. 326/39 |
| 7,116,135 | B2 * | 10/2006 | Wang et al. .................... 327/108 |
| 8,458,383 | B1 * | 6/2013 | Wortman et al. ............... 710/62 |
| 8,487,665 | B2 * | 7/2013 | Wang et al. .................... 327/108 |
| 2006/0220703 | A1 * | 10/2006 | Wang et al. .................... 327/108 |
| 2008/0104456 | A1 * | 5/2008 | Talbot ............................ 714/704 |
| 2013/0121091 | A1 * | 5/2013 | Koshizuka ............... 365/189.14 |

FOREIGN PATENT DOCUMENTS

KR  1020100041390  4/2010

* cited by examiner

*Primary Examiner* — Alexander H Taningco
*Assistant Examiner* — Dylan White
(74) *Attorney, Agent, or Firm* — IP & T Group LLP

(57) ABSTRACT

An integrated circuit chip includes a first single ended type buffer configured to receive a first signal through a first pad, a second single ended type buffer configured to receive a second signal through a second pad, a differential type buffer configured to receive a third signal through the first pad and the second pad, a strobe input unit configured to receive a strobe signal synchronized with the third signal inputted to the first pad and the second pad, and a buffer control unit configured to control activation of the first and second single ended type buffers and the differential type buffer in response to the strobe signal.

11 Claims, 10 Drawing Sheets

INTEGRATED CIRCUIT CHIP

CROSS-REFERENCE TO RELATED APPLICATIONS

The present application claims priority of Korean Patent Application No. 10-2011-0107954, filed on Oct. 21, 2011, which is incorporated herein by reference in its entirety.

BACKGROUND

1. Field

Exemplary embodiments of the present invention relate to an integrated circuit chip, and more particularly, to buffers for receiving signals inputted to an integrated circuit chip and drivers for outputting signals to an outside of the integrated circuit chip.

2. Description of the Related Art

Various integrated circuit chips operate while transmitting and receiving data (signals) to and from other chips. For example, memory chips such as a DRAM and a flash memory transmit and receive data to and from memory controllers. Also, a CPU transmits and receives data to and from various chips on a mother board. With the development of technologies, a data transmission speed is increased. As a data transmission frequency is increased, a data eye for data recognition is decreased. The decreased data eye may be more vulnerable to influences from power noise or impedance mismatching caused due to internal or external factors of a chip and influences by variations in processes.

Data transmission types are divided into a single ended type and a different type. Single ended type data transmission refers to a type in which one data is transmitted to one data pad, and it may be vulnerable to noise, while having the large number of channels and reduced current consumption. Differential type data transmission refers to a type in which one data is transmitted to two data pads in such a manner that main data is transmitted to one data pad and sub data (data obtained by inverting the main data) is transmitted to the other data pad. In such differential type data transmission, the logic value of data is recognized by comparing the voltage levels of the main data and the sub data. Therefore, the differential type data transmission has the small number of channels and augmented current consumption, while being invulnerable to noise.

Thus, a technique for appropriately combining the single ended type data transmission and reception and the differential type data transmission and reception is being developed.

SUMMARY

An embodiment of the present invention is directed to appropriate combination of single ended type and differential type data transmission and reception to provide an optimal data transmission and reception method.

In accordance with an embodiment of the present invention, an integrated circuit chip may include: a first single ended type buffer configured to receive a first signal through a first pad; a second single ended type buffer configured to receive a second signal through a second pad; a differential type buffer configured to receive a third signal through the first pad and the second pad; a strobe input unit configured to receive a strobe signal synchronized with the third signal inputted to the first pad and the second pad; and a buffer control unit configured to control activation of the first and second single ended type buffers and the differential type buffer in response to the strobe signal.

In accordance with another embodiment of the present invention, an integrated circuit chip may include: a first driver configured to output first high and low speed signals through a first pad; a second driver configured to output second high and low speed signals through a second pad; a strobe generation unit configured to generate a strobe signal in synchronization with the first and second high speed signals to be outputted to the first pad and the second pad; a strobe output unit configured to output the strobe signal; and a driver control unit configured to control the first driver and the second driver to output the first and second high speed signals in a differential type or the first and second low speed signals in a single ended type.

In accordance with another embodiment of the present invention, an integrated circuit chip may include: a first single ended type buffer configured to receive a first signal through a first pad; a second single ended type buffer configured to receive a second signal through a second pad; a differential type buffer configured to receive a third signal through the first pad and the second pad; a status signal input unit configured to receive at least one status signal indicating which one of the first to third signals are inputted to the first pad and the second pad; and a buffer control unit configured to activate the differential type buffer or the first and second single ended type buffers in response to the status signal.

In accordance with still another embodiment of the present invention, an integrated circuit chip may include: a first pad; a second pad; a first single ended type buffer connected to the first pad; a second single ended type buffer connected to the second pad; and a differential type buffer connected to the first pad and the second pad, wherein one type of buffer between the differential type buffer and the first and second single ended type buffers may be activated in response to an operation mode set by an external input.

In accordance with yet another embodiment of the present invention, an integrated circuit chip may include: a first pad; a second pad; a first driver connected to the first pad; and a second driver connected to the second pad, wherein the first driver and the second driver are controlled to output data in a differential type or in a single ended type in response to an operation mode set by an external input. Setting of the operation mode may be implemented in an initial operation of the integrated circuit chip.

DETAILED DESCRIPTION

Figure 1:
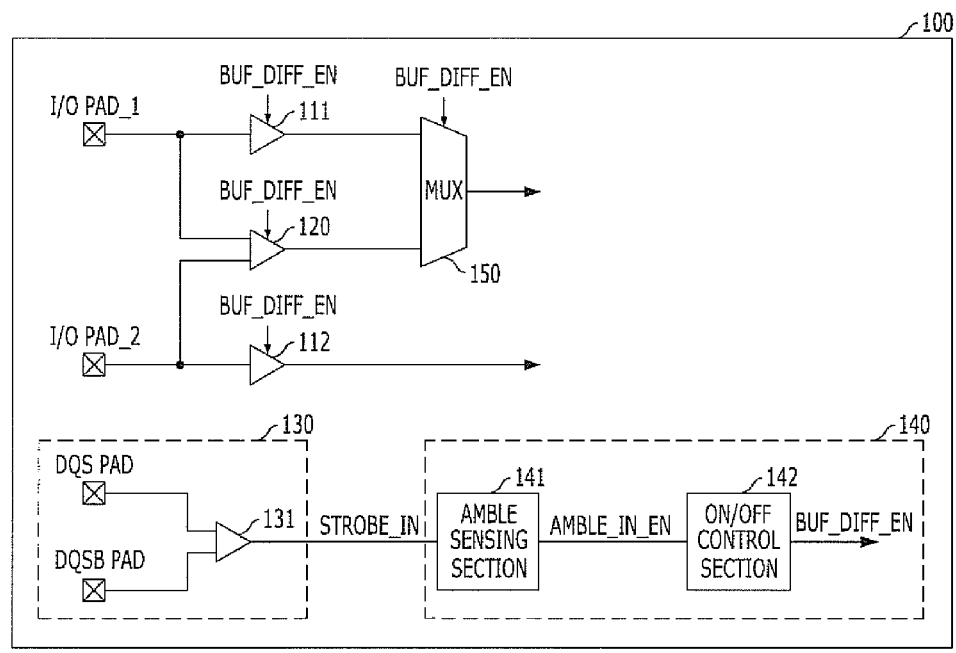
FIG. 1 is a diagram showing reception of data (signals) in an integrated circuit chip in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the following embodiments, methods for effective conversion between single ended type data transmission and reception and differential type data transmission and reception will be described.

First Embodiment

Protocol Conversion Using a Strobe Signal

FIG. 1 is a diagram showing reception of data (signals) in an integrated circuit chip in accordance with a first embodiment of the present invention.

Referring to FIG. 1, an integrated circuit chip 100 includes a first pad I/O PAD_1, a second pad I/O PAD_2, a first single ended type buffer 111, a second single ended type buffer 112, a differential type buffer 120, a strobe input unit 130, and a buffer control unit 140.

The first pad I/O PAD_1 and the second pad I/O PAD_2 are pads which are inputted with data from an outside of the integrated circuit chip 100. The first pad I/O PAD_1 and the second pad I/O PAD_2 may be inputted with high speed (high frequency) data or low speed (low frequency) data.

The first single ended type buffer 111 is connected to the first pad I/O PAD_1 and receives in a single ended type the data inputted to the first pad I/O PAD_1. The second single ended type buffer 112 is connected to the second pad I/O PAD_2 and receives in the single ended type the data inputted to the second pad I/O PAD_2. The first single ended type buffer 111 and the second single ended type buffer 112 are activated and deactivated in response to a buffer select signal BUF_DIFF_EN. In detail, when the buffer select signal BUF_DIFF_EN has a low level, the first single ended type buffer 111 and the second single ended type buffer 112 are activated, and, when the buffer select signal BUF_DIFF_EN has a high level, the first single ended type buffer 111 and the second single ended type buffer 112 are deactivated.

The differential type buffer 120 is connected to the first pad I/O PAD_1 and the second pad I/O PAD_2 and receives in a differential type the data inputted to the first pad I/O PAD_1 and the second pad I/O PAD_2. If the differential type buffer 120 is activated, main data is inputted to the first pad I/O PAD_1, and sub data (data obtained by inverting the main data) is inputted to the second pad I/O PAD_2. The differential type buffer 120 is activated and deactivated in response to the buffer select signal BUF_DIFF_EN. In detail, when the buffer select signal BUF_DIFF_EN has the high level, the differential type buffer 120 is activated, and, when the buffer select signal BUF_DIFF_EN has the low level, the differential type buffer 120 is deactivated.

The strobe input unit 130 is configured to be inputted with a strobe signal applied from the outside of the integrated circuit chip 100. The strobe input unit 130 includes a main strobe pad DQS PAD, a sub strobe pad DQSB PAD and a differential type buffer 131. A strobe signal is inputted to the main strobe pad DQS PAD and the sub strobe pad DQSB PAD in the differential type. A strobe signal STROBE_IN is synchronized with the high speed data (the data inputted in the differential type) inputted to the first pad I/O PAD_1 and the second pad I/O PAD_2. In the case low speed data (the data inputted in the single ended type) are inputted to the first pad I/O PAD_1 and the second pad I/O PAD_2, the strobe signal STROBE_IN is not used since the margin of the data is sufficient. That is to say, the strobe signal STROBE_IN inputted through the strobe input unit 130 is a signal for stably latching the high speed data when they are inputted to the first pad I/O PAD_1 and the second pad I/O PAD_2 in the differential type. Since a configuration for latching the data inputted to the first pad I/O PAD_1 and the second pad I/O PAD_2 is not directly associated with the present invention, it is not shown in FIG. 1. The strobe signal STROBE_IN toggles/pulses in the case that the high speed data are inputted to the first pad I/O PAD_1 and the second pad I/O PAD_2 in the differential type. The strobe signal STROBE_IN has a preamble period of a given time immediately before the high speed data are inputted to the first pad I/O PAD_1 and the second pad I/O PAD_2, and it has a postamble period of the given time after the high speed data are inputted to the first pad I/O PAD_1 and the second pad I/O PAD_2.

The buffer control unit 140 is configured to control activation and deactivation of the first single ended type buffer 111, the second single ended type buffer 112 and the differential type buffer 120. In the case that separate data are inputted to the first pad I/O PAD_1 and the second pad I/O PAD_2 in the single ended type, the buffer control unit 140 activates the first single ended type buffer 111 and the second single ended type buffer 112, and, in the case that data are inputted to the first pad I/O PAD_1 and the second pad I/O PAD_2 in the differential type, the buffer control unit 140 activates the differential type buffer 120. The buffer control unit 140 controls the activation and deactivation of the first single ended type buffer 111, the second single ended type buffer 112 and the differential type buffer 120 in response to the strobe signal STROBE_IN received through the strobe input unit 130. In detail, the buffer control unit 140 activates the differential type buffer 120 in response to the preamble of the strobe signal STROBE_IN and deactivates the differential type buffer 120 in response to the postamble of the strobe signal STROBE_IN. This is because the period from after the preamble period of the strobe signal STROBE_IN to before the postamble of the strobe signal STROBE_IN is the period in which data are inputted to the first pad I/O PAD_1 and the second pad I/O PAD_2 in the differential type. The activation and deactivation of the first single ended type buffer 111 and the second single ended type buffer 112 is controlled in a reverse way to the activation and deactivation of the differential type buffer 120. In other words, when the differential type buffer 120 is activated, the first single ended type buffer 111 and the second single ended type buffer 112 are deactivated, and, when the differential type buffer 120 is deactivated, the first single ended type buffer 111 and the second single ended type buffer 112 are activated.

The buffer control unit 140 includes an amble sensing section 141 and an on/off control section 142. The amble sensing section 141 senses the preamble or the postamble when the strobe signal STROBE_IN maintains a low level at least for a given time, and it activates an amble activation signal AMBLE_IN_EN. The on/off control section 142 changes the logic level of the buffer select signal BUF_DIFF_EN each time the amble activation signal AMBLE_IN_EN is activated. The on/off control section 142 may be realized using a simple T flip-flop circuit. The buffer select signal BUF_DIFF_EN controls the activation and deactivation of the differential type buffer 120, the first single ended type buffer 111 and the second single ended type buffer 112. The differential type buffer 120 is activated when the buffer select signal BUF_DIFF_EN has the high level, and the first single ended type buffer 111 and the second single ended type buffer 112 are activated when the buffer select signal BUF_DIFF_EN has the low level.

The reason why the amble sensing section 141 activates the amble activation signal AMBLE_IN_EN when the strobe signal STROBE_IN maintains the low level for the given time is because the preamble and the postamble are exemplified as being defined as the period in which the strobe signal STROBE_IN has the low level for the given time. If the preamble and the postamble are defined as the period in which the strobe signal STROBE_IN maintains a high level at least for the given time, the amble sensing section 141 activates the amble activation signal AMBLE_IN_EN when the strobe signal STROBE_IN maintains the high level for the given time.

A selection unit 150 is configured to transfer the data inputted through the differential type buffer 120 to an internal circuit (not shown) while the differential type buffer 120 is activated and transfer the data inputted through the first single ended type buffer 111 to the internal circuit while the first single ended type buffer 111 is activated. Selection of the selection unit 150 may be controlled by the buffer select signal BUF_DIFF_EN.

Although only one first pad I/O PAD_1 and only one second pad I/O PAD_2 are shown in FIG. 1, each of the first pad I/O PAD_1 and the second pad I/O PAD_2 and each of the first single ended type buffer 111, the second single ended type buffer 112 and the differential type buffer 120 connected thereto may be provided in a plural number.

Also, although it was described with reference to FIG. 1 that one type of buffer among the differential type buffer 120, the first single ended type buffer 111 and the second single ended type buffer 112 is activated, all buffers may be deactivated in a period in which the integrated circuit chip 100 does not operate. In this case, when an activation signal (not shown) for the integrated circuit chip 100 is deactivated, the buffer select signal BUF_DIFF_EN inputted to the differential type buffer 120 may be controlled to maintain the low level and the buffer select signal BUF_DIFF_EN inputted to the first single ended type buffer 111 and the second single ended type buffer 112 may be controlled to maintain the high level, regardless of the logic level of the buffer select signal BUF_DIFF_EN outputted from the on/off control section 142.

Figure 2:
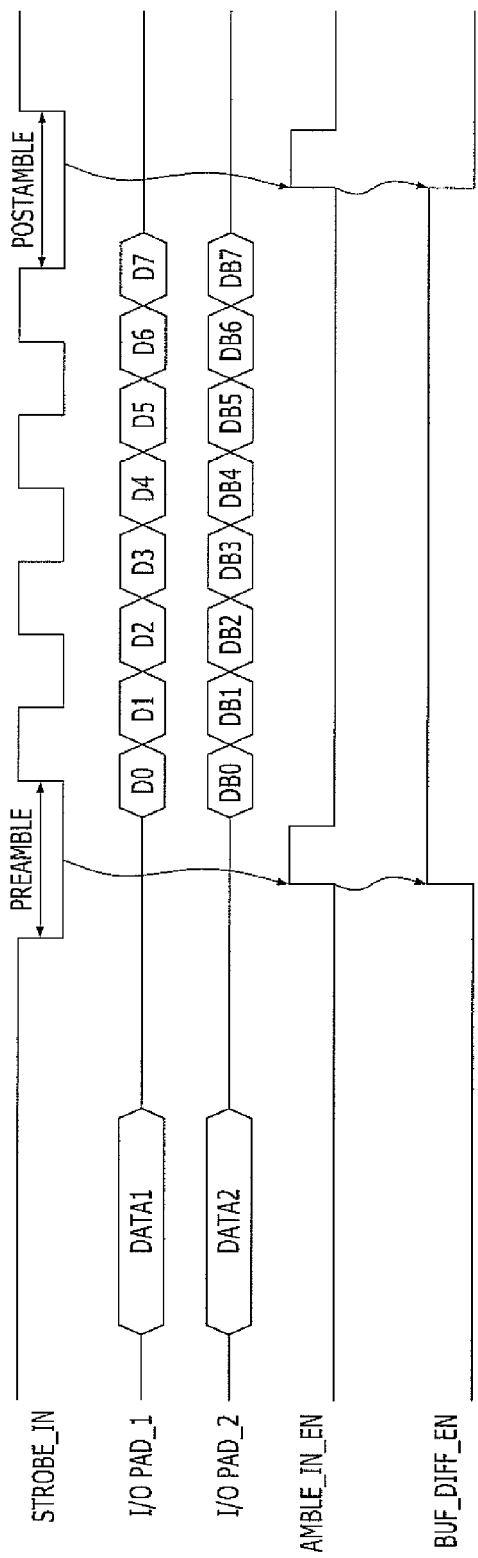
FIG. 2 is a timing diagram showing operations in which the integrated circuit chip shown in FIG. 1 receives data.

FIG. 2 is a timing diagram showing operations in which the integrated circuit chip shown in FIG. 1 receives data.

Referring to FIG. 2, the buffer select signal BUF_DIFF_EN maintains the low level as an initial value, and as a result of this, the first single ended type buffer 111 and the second single ended type buffer 112 are activated. Further, while the first single ended type buffer 111 and the second single ended type buffer 112 are activated, data DATA1 and DATA2 are inputted to the first pad I/O PAD_1 and the second pad I/O PAD_2 in the single ended type and then inputted through the first single ended type buffer 111 and the second single ended type buffer 112. While the data are inputted to the first pad I/O PAD_1 and the second pad I/O PAD_2 in the single ended type, the strobe signal STROBE_IN maintains the high level and does not toggle.

The strobe signal STROBE_IN maintains the low level for the given time before high speed data D0-D7 and DB0-DB7 are inputted to the first pad I/O PAD_1 and the second pad I/O PAD_2 in the differential type, and the given time represents the preamble period notifying that high speed data are to be inputted. The amble sensing section 141 senses the preamble and activates the amble activation signal AMBLE_IN_EN to a high level. Then, the on/off control section 142 changes the level of the buffer select signal BUF_DIFF_EN to the high level, and in response to this, the differential type buffer 120 is activated and the first single ended type buffer 111 and the second single ended type buffer 112 are deactivated. After the high speed data are completely inputted in the differential type, the strobe signal STROBE_IN maintains again the low level for the given time, and the given time represents the postamble period notifying that input of the high speed data is completed. The amble sensing section 141 senses the postamble and activates the amble activation signal AMBLE_IN_EN to the high level. Then, the on/off control section 142 changes the level of the buffer select signal BUF_DIFF_EN to the low level, and in response to this, the differential type buffer 120 is deactivated and the first single ended type buffer 111 and the second single ended type buffer 112 are activated.

Namely, in the integrated circuit chip 100, the first single ended type buffer 111 and the second single ended type buffer 112 are basically activated, and the differential type buffer 120 is activated only in the period in which the high speed data are inputted in the differential type. As a result, when the low speed data are inputted to the first pad I/O PAD_1 and the second pad I/O PAD_2 in the single ended type, the integrated circuit chip 100 uses the first single ended type buffer 111 and the second single ended type buffer 112 to increase the number of channels and reduce current consumption, and, when the high speed data are inputted to the first pad I/O PAD_1 and the second pad I/O PAD_2 in the differential type, the integrated circuit chip 100 uses the differential type buffer 120 to recognize the high speed data without an error.

For reference, in the case that the data are inputted to the first pad I/O PAD_1 and the second pad I/O PAD_2 in the differential type, although the number of data channels is decreased to a half of that in the case that the data are inputted in the single ended type, high frequency data may be received in the differential type to allow the reception of the high speed data.

Figure 3:
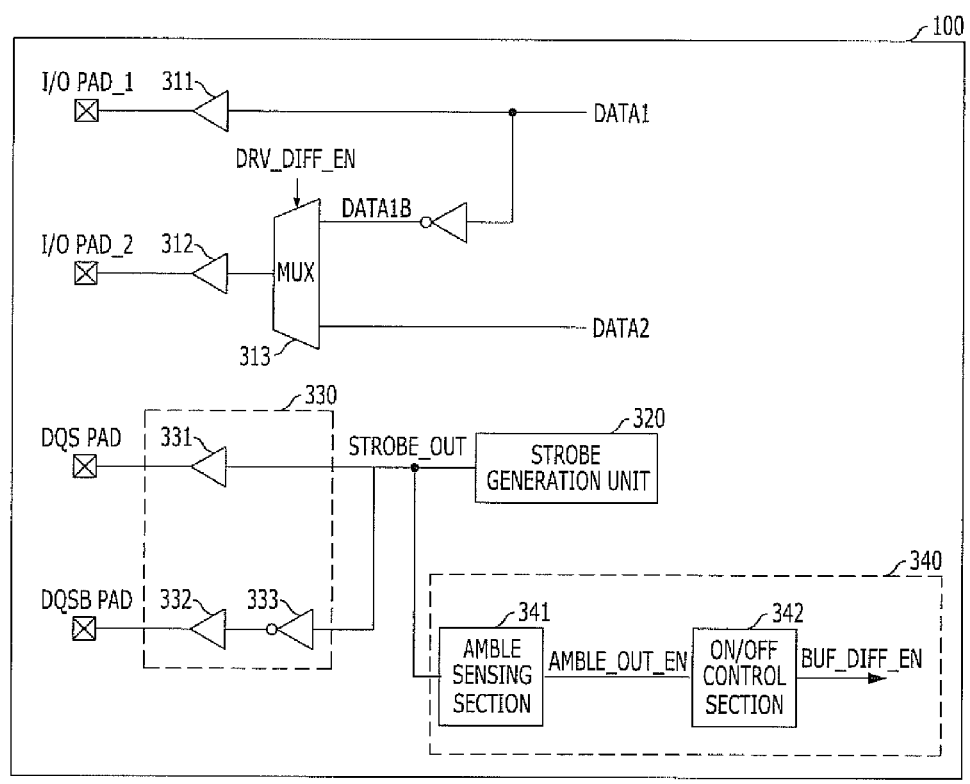
FIG. 3 is a diagram showing transmission of data (signals) in the integrated circuit chip in accordance with the first embodiment of the present invention.

FIG. 3 is a diagram showing transmission of data (signals) in the integrated circuit chip in accordance with the first embodiment of the present invention.

Referring to FIG. 3, an integrated circuit chip 100 includes a first pad I/O PAD_1, a second pad I/O PAD_2, a first driver 311, a second driver 312, a strobe generation unit 320, a strobe output unit 330, and a driver control unit 340.

The first pad I/O PAD_1 and the second pad I/O PAD_2 are pads for outputting data to an outside of the integrated circuit chip 100. High speed data or low speed data may be outputted through the first pad I/O PAD_1 and the second pad I/O PAD_2.

The first driver 311 is connected to the first pad I/O PAD_1 and outputs data to the first pad I/O PAD_1. The second driver 312 is connected to the second pad I/O PAD_2 and outputs data to the second pad I/O PAD_2. The first driver 311 and the second driver 312 respectively output separate data DATA1 and DATA2 in a single ended type, or the first driver 311 outputs main data DATA1 and the second driver 312 outputs sub data DATA1B in a differential type.

A type in which data are to be outputted through the first driver 311 and the second driver 312 is determined by a driver select signal DRV_DIFF_EN. When the driver select signal DRV_DIFF_EN is activated to a high level, a selection unit 313 allows the sub data DATA1B obtained by inverting the main data DATA1 to be outputted through the second driver 312, and, when the driver select signal DRV_DIFF_EN is deactivated to a low level, the selection unit 313 allows the data DATA2 to be outputted through the second driver 312. That is to say, when the driver select signal DRV_DIFF_EN is activated to the high level, the data DATA1 and DATA1B are outputted through the first driver 311 and the second driver 312 in the differential type, and, when the driver select signal DRV_DIFF_EN is deactivated to the low level, the separate data DATA1 and DATA2 are outputted through the first driver 311 and the second driver 312 in the single ended type.

The strobe generation unit 320 is configured to generate a strobe signal STROBE_OUT in synchronization with the high speed data (the data outputted in the differential type) outputted through the first pad I/O PAD_1 and the second pad I/O PAD_2. In the case that low speed data are to be outputted through the first pad I/O PAD_1 and the second pad I/O PAD_2, the strobe signal STROBE_OUT is not used since the margin of the data is sufficient. The strobe signal STROBE_OUT toggles in a period during which the high speed data are outputted from the integrated circuit chip 100. The strobe signal STROBE_OUT is generated to have a preamble period of a given time immediately before the high speed data are outputted from the integrated circuit chip 100 and a postamble period of the given time after the high speed data are outputted from the integrated circuit chip 100.

The strobe output unit 330 is configured to output the strobe signal STROBE_OUT, generated by the strobe generation unit 320, to a main strobe pad DQS PAD and a sub strobe pad DQSB PAD in the differential type. The strobe output unit 330 includes two drivers 331 and 332 and an inverter 333.

The driver control unit 340 is configured to perform a control task such that the data DATA1 and DATA1B are outputted through the first driver 311 and the second driver 312 in the differential type or the data DATA1 and DATA2 are outputted through the first driver 311 and the second driver 312, respectively, in the single ended type. The driver control unit 340 operates in response to the strobe signal STROBE_OUT generated by the strobe generation unit 320. In detail, the driver control unit 340 activates the driver select signal DRV_DIFF_EN in response to the preamble of the strobe signal STROBE_OUT and deactivates the driver select signal DRV_DIFF_EN in response to the postamble of the strobe signal STROBE_OUT. This is because the period from after the preamble period of the strobe signal STROBE_OUT to before the postamble of the strobe signal STROBE_OUT is the period in which data are outputted through the first pad I/O PAD_1 and the second pad I/O PAD_2 in the differential type.

The driver control unit 340 includes an amble sensing section 341 and an on/off control section 342. The amble sensing section 341 senses the preamble or the postamble when the strobe signal STROBE_OUT maintains a low level at least for a given time, and it activates an amble activation signal AMBLE_OUT_EN. The on/off control section 342 changes the logic level of the driver select signal DRV_DIFF_EN each time the amble activation signal AMBLE_OUT_EN is activated. When the driver select signal DRV_DIFF_EN has the high level, the data DATA1 and DATA1B are outputted through the first driver 311 and the second driver 312 in the differential type, and, when the driver select signal DRV_DIFF_EN has the low level, the data DATA1 and DATA2 are outputted through the first driver 311 and the second driver 312, respectively, in the single ended type.

Although component elements associated with reception of data in the integrated circuit chip 100 are shown in FIG. 1 and component elements associated with transmission of data in the integrated circuit chip 100 are shown in FIG. 3, the configurations of FIGS. 1 and 3 may coexist in the integrated circuit chip 100.

Figure 4:
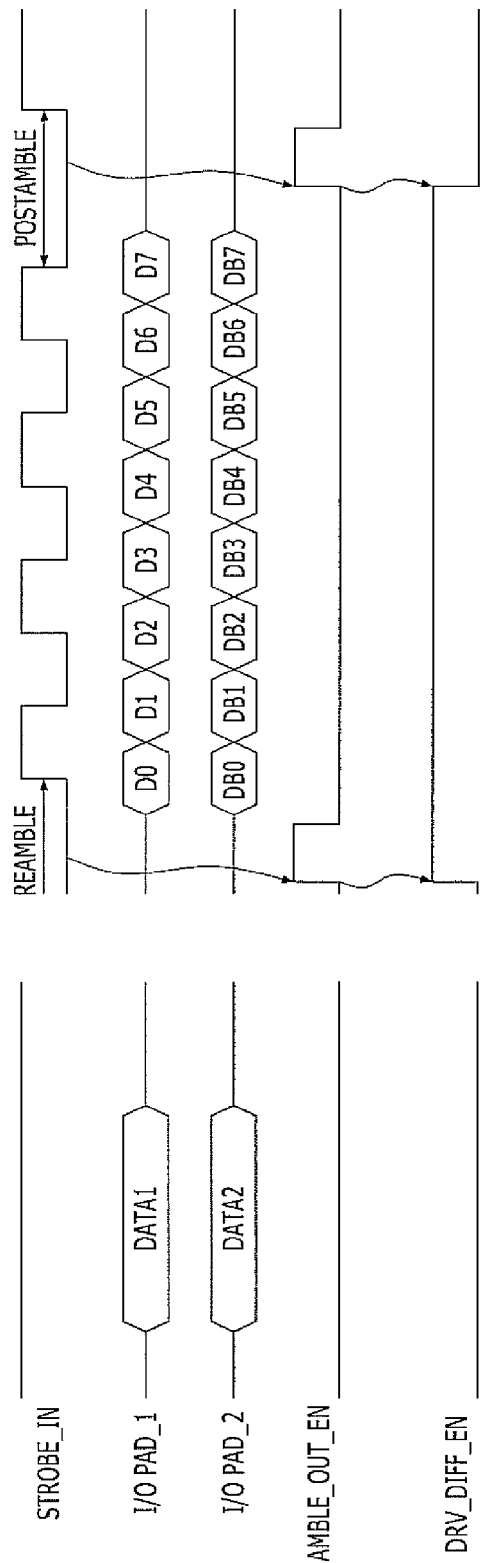
FIG. 4 is a timing diagram showing operations in which the integrated circuit chip shown in FIG. 3 transmits data.

FIG. 4 is a timing diagram showing operations in which the integrated circuit chip shown in FIG. 3 transmits data.

Referring to FIG. 4, the driver select signal DRV_DIFF_EN maintains the low level as an initial value. While the driver select signal DRV_DIFF_EN maintains the low level, the data DATA1 and DATA2 are respectively outputted through the first pad I/O PAD_1 and the second pad I/O PAD_2 in the single ended type.

Thereafter, the strobe signal STROBE_OUT maintains the low level for the given time, and the given time represents the preamble period. In response to the preamble period, the driver select signal DRV_DIFF_EN transitions to the high level. While the driver select signal DRV_DIFF_EN maintains the high level, the data D0-D7 and DB0-DB7 are outputted through the first pad I/O PAD_1 and the second pad I/O PAD_2 in the differential type. After the data are completely outputted, the strobe signal STROBE_OUT maintains again the low level for the given time, and the given time represents the postamble period. In response to the postamble period, the driver select signal DRV_DIFF_EN transitions to the low level.

Second Embodiment

Protocol Conversion Using Status Signals

Figure 5:
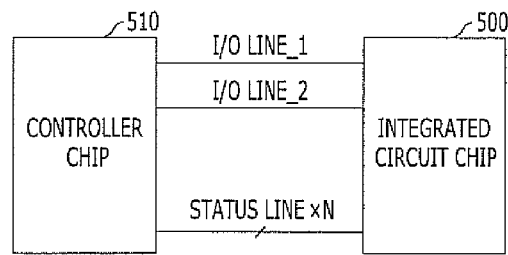
FIG. 5 is a configuration diagram of a system including an integrated circuit chip in accordance with a second embodiment of the present invention and a controller chip for controlling the same.

FIG. 5 is a configuration diagram of a system including an integrated circuit chip in accordance with a second embodiment of the present invention and a controller chip for controlling the same.

Referring to FIG. 5, a system includes an integrated circuit chip 500, a controller chip 510, I/O lines I/O LINE_1 and I/O LINE_2 between the integrated circuit chip 500 and the controller chip 510, and one or more status signal lines STATUS LINE xN.

The integrated circuit chip 500 is a chip which operates under the control of the controller chip 510. The integrated circuit chip 500 may be any chip which exchanges signals with the controller chip 510 under the control of the controller chip 510. For example, the controller chip 510 may be a memory controller, and the integrated circuit chip 500 may be a memory which operates under the control of the memory controller.

The I/O lines I/O LINE_1 and I/O LINE_2 are channels through which signals (data) are transferred from the controller chip 510 to the integrated circuit chip 500. Low speed signals may be transferred through the I/O lines I/O LINE_1 and I/O LINE_2 in a single ended type, or high speed signals may be transferred through the I/O lines I/O LINE_1 and I/O LINE_2 in a differential type.

The one or more status signal lines STATUS LINE xN transfer one or more status signals. The status signals are signals which inform of the kinds of the signals transferred by the controller chip 510 to the integrated circuit chip 500 through the I/O lines I/O LINE_1 and I/O LINE_2. In other words, the status signals include information on whether the signals transferred through the I/O lines I/O LINE_1 and I/O LINE_2 are high speed signals or low speed signals.

The integrated circuit chip 500 is provided with buffers (not shown) for receiving the signals of the I/O lines I/O LINE_1 and I/O LINE_2. The integrated circuit chip 500 receives the signals of the I/O lines I/O LINE_1 and I/O LINE_2 in the differential type or in the single ended type in response to the status signals transferred through the one or more status signal lines STATUS LINE xN.

The numbers of the I/O lines I/O LINE_1 and I/O LINE_2 and the status signal lines STATUS LINE xN may be changed depending on circuit design purposes.

Figure 6:
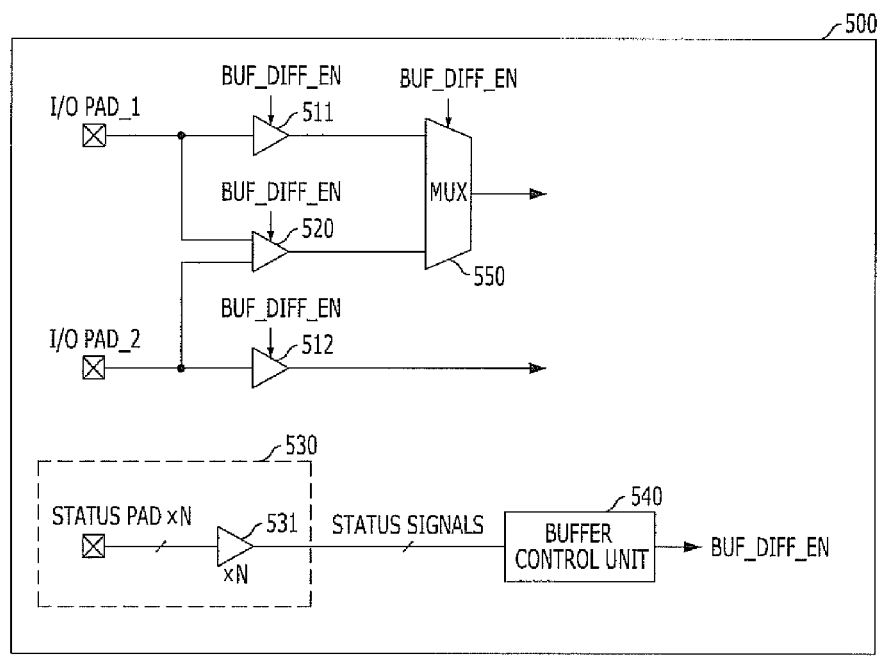
FIG. 6 is a diagram showing reception of data (signals) in the integrated circuit chip in accordance with the second embodiment of the present invention.

FIG. 6 is a diagram showing reception of data (signals) in the integrated circuit chip in accordance with the second embodiment of the present invention.

Referring to FIG. 6, the integrated circuit chip 500 includes a first pad I/O PAD_1, a second pad I/O PAD_2, a first single ended type buffer 511, a second single ended type buffer 512, a differential type buffer 520, a status signal input unit 530, and a buffer control unit 540.

The first pad I/O PAD_1 and the second pad I/O PAD_2 are pads which are inputted with data from an outside of the integrated circuit chip 500. The first pad I/O PAD_1 and the second pad I/O PAD_2 may be inputted with high speed (high frequency) data or low speed (low frequency) data.

The first single ended type buffer 511 is connected to the first pad I/O PAD_1 and receives in the single ended type the signal inputted to the first pad I/O PAD_1. The second single ended type buffer 512 is connected to the second pad I/O PAD_2 and receives in the single ended type the signal inputted to the second pad I/O PAD_2. The first single ended type buffer 511 and the second single ended type buffer 512 are activated and deactivated in response to a buffer select signal BUF_DIFF_EN. In detail, when the buffer select signal BUF_DIFF_EN has a low level, the first single ended type buffer 511 and the second single ended type buffer 512 are activated, and, when the buffer select signal BUF_DIFF_EN has a high level, the first single ended type buffer 511 and the second single ended type buffer 512 are deactivated.

The differential type buffer 520 is connected to the first pad I/O PAD_1 and the second pad I/O PAD_2 and receives in the differential type the signals inputted to the first pad I/O PAD_1 and the second pad I/O PAD_2. If the differential type buffer 520 is activated, a main signal is inputted to the first pad I/O PAD_1, and a sub signal (a signal obtained by inverting the main signal) is inputted to the second pad I/O PAD_2. The differential type buffer 520 is activated and deactivated in response to the buffer select signal BUF_DIFF_EN. In detail, when the buffer select signal BUF_DIFF_EN has the high level, the differential type buffer 520 is activated, and, when the buffer select signal BUF_DIFF_EN has the low level, the differential type buffer 520 is deactivated.

The status signal input unit 530 receives status signals STATUS SIGNALS which are inputted through N number of status pads STATUS PAD xN. The status signal input unit 530 may include N number of buffers 531 which are connected to the N number of status pads STATUS PAD xN. Since the status signals STATUS SIGNALS are signals which notify the kinds of the signals inputted through the first pad I/O PAD_1 and the second pad I/O PAD_2, they need not be inputted at high speeds. Accordingly, the buffers 531 may be configured in the single ended type. Of course, the buffers 531 may be configured in the differential type depending on circuit design purposes.

The buffer control unit 540 is configured to activate the differential type buffer 520 or the first single ended type buffer 511 and the second single ended type buffer 512 in response to the one or more status signals STATUS SIGNALS. In the case that the status signals STATUS SIGNALS indicate that the high speed signals are inputted through the first pad I/O PAD_1 and the second pad I/O PAD_2 in the differential type, the buffer control unit 540 activates the differential type buffer 520, and, in the case that the status signals STATUS SIGNALS indicate that the low speed signals are inputted through the first pad I/O PAD_1 and the second pad I/O PAD_2 in the single ended type, the buffer control unit 540 activates the first single ended type buffer 511 and the second single ended type buffer 512. When the buffer select signal BUF_DIFF_EN outputted from the buffer control unit 540 has the high level, the differential type buffer 520 is activated, and, when the buffer select signal BUF_DIFF_EN has the low level, the first single ended type buffer 511 and the second single ended type buffer 512 are activated.

A selection unit 550 is configured to transfer the signal inputted through the differential type buffer 520 to an internal circuit (not shown) while the differential type buffer 520 is activated and transfer the signal inputted through the first single ended type buffer 511 to the internal circuit while the first single ended type buffer 511 is activated. Selection of the selection unit 550 may be controlled by the buffer select signal BUF_DIFF_EN.

Figure 7:
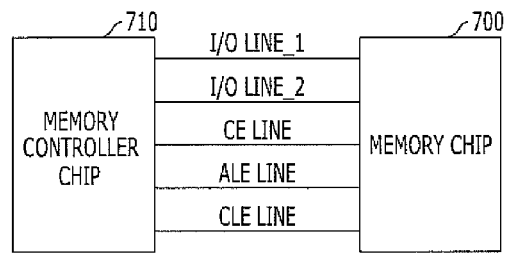
FIG. 7 is a diagram showing a memory system including the integrated circuit chip in accordance with the second embodiment of the present invention as a memory chip and a memory controller chip for controlling the same.

FIG. 7 is a diagram showing a memory system including the integrated circuit chip in accordance with the second embodiment of the present invention as a memory chip and a memory controller chip for controlling the same.

Referring to FIG. 7, a memory system includes a memory chip 700, a memory controller chip 710, a chip enable signal line CE LINE, an address latch enable signal line ALE LINE, a command latch enable signal line CLE LINE, and I/O lines I/O LINE_1 and I/O LINE_2.

The memory chip 700 stores data under the control of the memory controller chip 710. The memory system of the present embodiment may be applied to all kinds of memory systems in which high speed signals (data) and low speed signals (commands and addresses) are transferred through I/O lines I/O LINE_1 and I/O LINE_2. Hereinafter, it is described as an example that the memory chip 500 includes a flash memory as a nonvolatile memory.

The I/O lines I/O LINE_1 and I/O LINE_2 are lines through which data, addresses and commands are transferred from the memory controller chip 710 to the memory chip 700. On the I/O lines I/O LINE_1 and I/O LINE_2, data are transferred at a high speed (with a high frequency) in a differential type, and addresses and commands are transferred at a low speed (with a low frequency) in a single ended type. Although a plurality of (for example, at least eight) I/O lines are actually provided between a memory chip and a memory controller chip, descriptions will be made below by exemplifying two I/O lines I/O LINE_1 and I/O LINE_2.

An address latch enable signal ALE which is transferred to the address latch enable signal line ALE LINE and a command latch enable signal CLE which is transferred to the command latch enable signal line CLE LINE will be described below. The address latch enable signal ALE and the command latch enable signal CLE correspond to the status signals STATUS SIGNALS described above with reference to FIG. 5, and they may indicate the kinds of the signals transferred through the I/O lines I/O LINE_1 and I/O LINE_2. If the address latch enable signal ALE is activated to a high level, it is meant that addresses are transferred through the I/O lines I/O LINE_1 and I/O LINE_2, and, if the command latch enable signal CLE is activated to a high level, it is meant that commands are transferred through the I/O lines I/O LINE_1 and I/O LINE_2. If both the address latch enable signal ALE and the command latch enable signal CLE are deactivated, it is meant that data are transferred through the I/O lines I/O LINE_1 and I/O LINE_2. Accordingly, by using the address latch enable signal ALE and the command latch enable signal CLE, it may be known which ones among addresses, commands and data are transferred through the I/O lines I/O LINE_1 and I/O LINE_2.

A chip enable signal CE transferred through the chip enable signal line CE LINE indicates information on whether the memory chip 700 is selected or not. If the chip enable signal CE is deactivated to a high level, it is meant that the memory chip 700 is not selected to operate, and, if the chip enable signal CE is activated to a low level, it is meant that the memory chip 700 is selected to operate.

The memory chip 700 is provided with a differential type buffer, a first single ended type buffer and a second single ended type buffer (not shown) for receiving the signals of the I/O lines I/O LINE_1 and I/O LINE_2. The memory chip 700 activates the differential type buffer or the first single ended type buffer and the second single ended type buffer by using the address latch enable signal ALE and the command latch enable signal CLE transferred from the memory controller chip 710.

In a period during which addresses are inputted and in a period during which commands are inputted, the signals inputted through the I/O lines I/O LINE_1 and I/O LINE_2 are received in the single ended type by using the first single ended type buffer and the second single ended type buffer, and, in a period in which data are inputted, the signals inputted through the I/O lines I/O LINE_1 and I/O LINE_2 are received in the differential type by using the differential type buffer. Further, if the chip enable signal CE is deactivated to the high level, all buffers connected to the I/O lines I/O LINE_1 and I/O LINE_2 are deactivated. This is because no signals are inputted to the I/O lines I/O LINE_1 and I/O LINE_2 with the chip enable signal CE deactivated to the high level.

Figure 8:
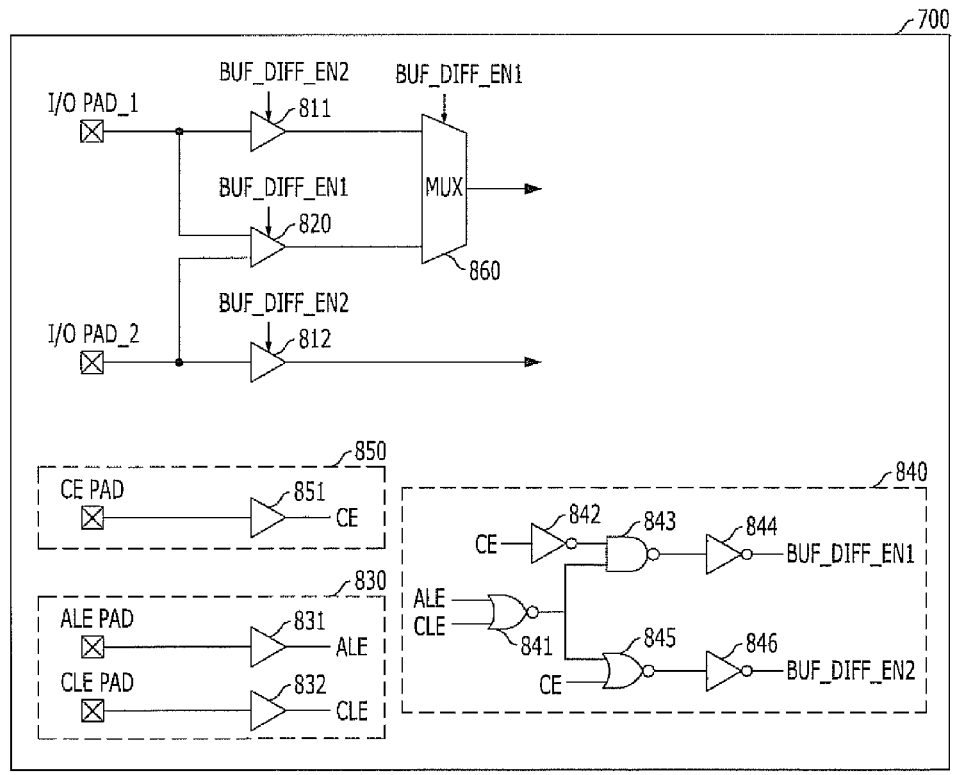
FIG. 8 is a diagram showing reception of signals in the memory chip shown in FIG. 7.

FIG. 8 is a diagram showing reception of signals in the memory chip shown in FIG. 7.

Referring to FIG. 8, the memory chip 700 includes a first pad I/O PAD_1, a second pad I/O PAD_2, a first single ended type buffer 811, a second single ended type buffer 812, a differential type buffer 820, a status signal input unit 830, a buffer control unit 840, and a chip enable signal input unit 850.

The first pad I/O PAD_1 and the second pad I/O PAD_2 are pads through which signals are inputted from the memory controller chip 710 to the memory chip 700. The first pad I/O PAD_1 and the second pad I/O PAD_2 may be inputted with addresses and commands in the single ended type or may be inputted with data in the differential type.

The first single ended type buffer 811 is connected to the first pad I/O PAD_1 and receives in the single ended type the address and command inputted to the first pad I/O PAD_1. The second single ended type buffer 812 is connected to the second pad I/O PAD_2 and receives in the single ended type the address and command inputted to the second pad I/O PAD_2. The first single ended type buffer 811 and the second single ended type buffer 812 are activated and deactivated in response to a second buffer select signal BUF_DIFF_EN2. In detail, when the second buffer select signal BUF_DIFF_EN2 has a low level, the first single ended type buffer 811 and the second single ended type buffer 812 are activated, and, when the second buffer select signal BUF_DIFF_EN2 has a high level, the first single ended type buffer 811 and the second single ended type buffer 812 are deactivated.

The differential type buffer 820 is connected to the first pad I/O PAD_1 and the second pad I/O PAD_2 and receives in the differential type the data inputted to the first pad I/O PAD_1 and the second pad I/O PAD_2. If the differential type buffer 820 is activated, main data is inputted to the first pad I/O PAD_1, and sub data (data obtained by inverting the main data) is inputted to the second pad I/O PAD_2. The differential type buffer 820 is activated and deactivated in response to a first buffer select signal BUF_DIFF_EN1. In detail, when the first buffer select signal BUF_DIFF_EN1 has a high level, the differential type buffer 820 is activated, and, when the first buffer select signal BUF_DIFF_EN1 has a low level, the differential type buffer 820 is deactivated.

The status signal input unit 830 is configured to be inputted with the address latch enable signal ALE and the command latch enable signal CLE. The status signal input unit 830 may include an address latch enable pad ALE PAD, a command latch enable pad CLE PAD, and buffers 831 and 832.

The chip enable signal input unit 850 may include a chip enable pad CE PAD and a buffer 851.

The buffer control unit 840 is configured to control activation and deactivation of the differential type buffer 820 or the first single ended type buffer 811 and the second single ended type buffer 812 in response to the address latch enable signal ALE, the command latch enable signal CLE and the chip enable signal CE. In the case that both the address latch enable signal ALE and the command latch enable signal CLE are deactivated to low levels, the buffer control unit 840 activates the differential type buffer 820, and, in the case that at least one of the address latch enable signal ALE and the command latch enable signal CLE is activated to the high level, the buffer control unit 840 activates the first single ended type buffer 811 and the second single ended type buffer 812. If the chip enable signal CE is deactivated to the high level, all the buffers 811, 812 and 820 are deactivated. The buffer control unit 840 may include NOR gates 841 and 845, inverters 842, 844 and 846, and a NAND gate 843. The first buffer select signal BUF_DIFF_EN1 generated by the buffer control unit 840 is a signal for controlling the activation and deactivation of the differential type buffer 820. If the first buffer select signal BUF_DIFF_EN1 has the high level, the differential type buffer 820 is activated, and, if the first buffer select signal BUF_DIFF_EN1 has the low level, the differential type buffer 820 is deactivated. Furthermore, the second buffer select signal BUF_DIFF_EN2 generated by the buffer control unit 840 is a signal for controlling the activation and deactivation of the first single ended type buffer 811 and the second single ended type buffer 812. If the second buffer select signal BUF_DIFF_EN2 has the low level, the first single ended type buffer 811 and the second single ended type buffer 812 are activated, and, if the second buffer select signal BUF_DIFF_EN2 has the high level, the first single ended type buffer 811 and the second single ended type buffer 812 are deactivated.

Operations of the buffer control unit 840 are shown in Table 1.

TABLE 1

| CE | ALE | CLE | BUF_DIFF_EN1 | BUF_DIFF_EN2 | Buffer to be Activated |
|----|-----|-----|--------------|--------------|------------------------|
| L | H | L | L | L | 811, 812 |
| L | L | H | L | L | 811, 812 |
| L | H | H | L | L | 811, 812 |
| L | L | L | H | H | 820 |
| H | Don't care | Don't care | L | H | Deactivate all buffers |

A selection unit 860 is configured to transfer the data inputted through the differential type buffer 820 to an internal circuit (not shown) while the differential type buffer 820 is activated and transfer the address or command inputted through the first single ended type buffer 811 to the internal circuit while the first single ended type buffer 811 is activated. Selection of the selection unit 860 may be controlled by the first buffer select signal BUF_DIFF_EN1.

Figure 9:
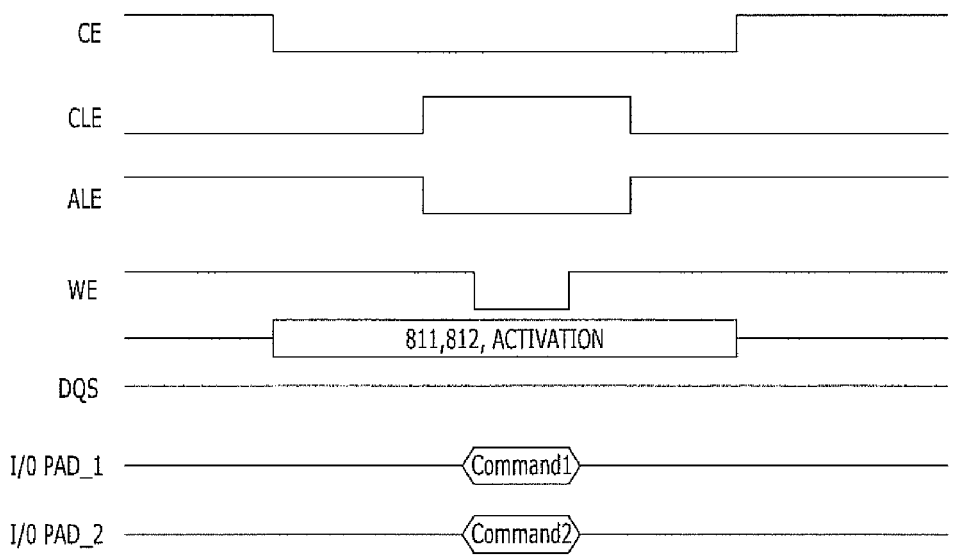
FIGS. 9 to 11 are timing diagrams showing operations of the memory system shown in FIG. 7.
Figure 10:
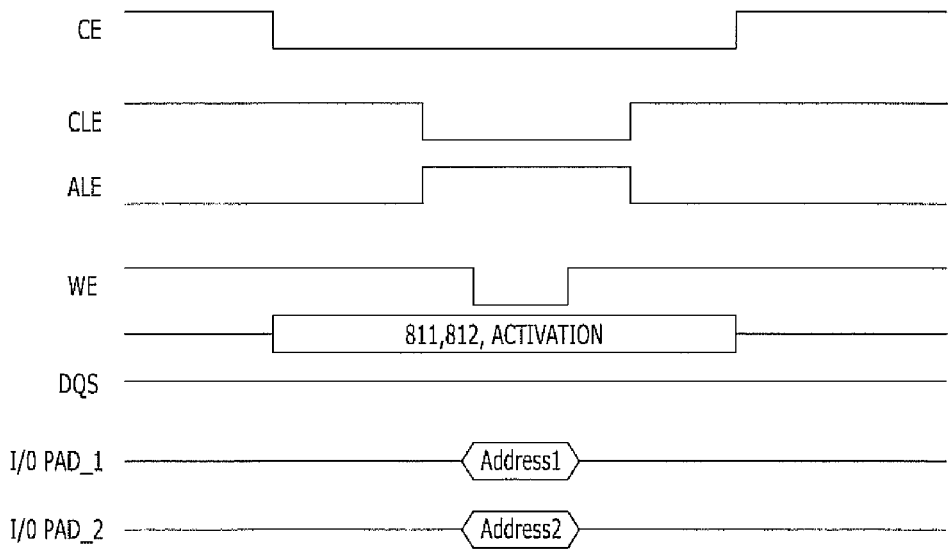
Figure 11:
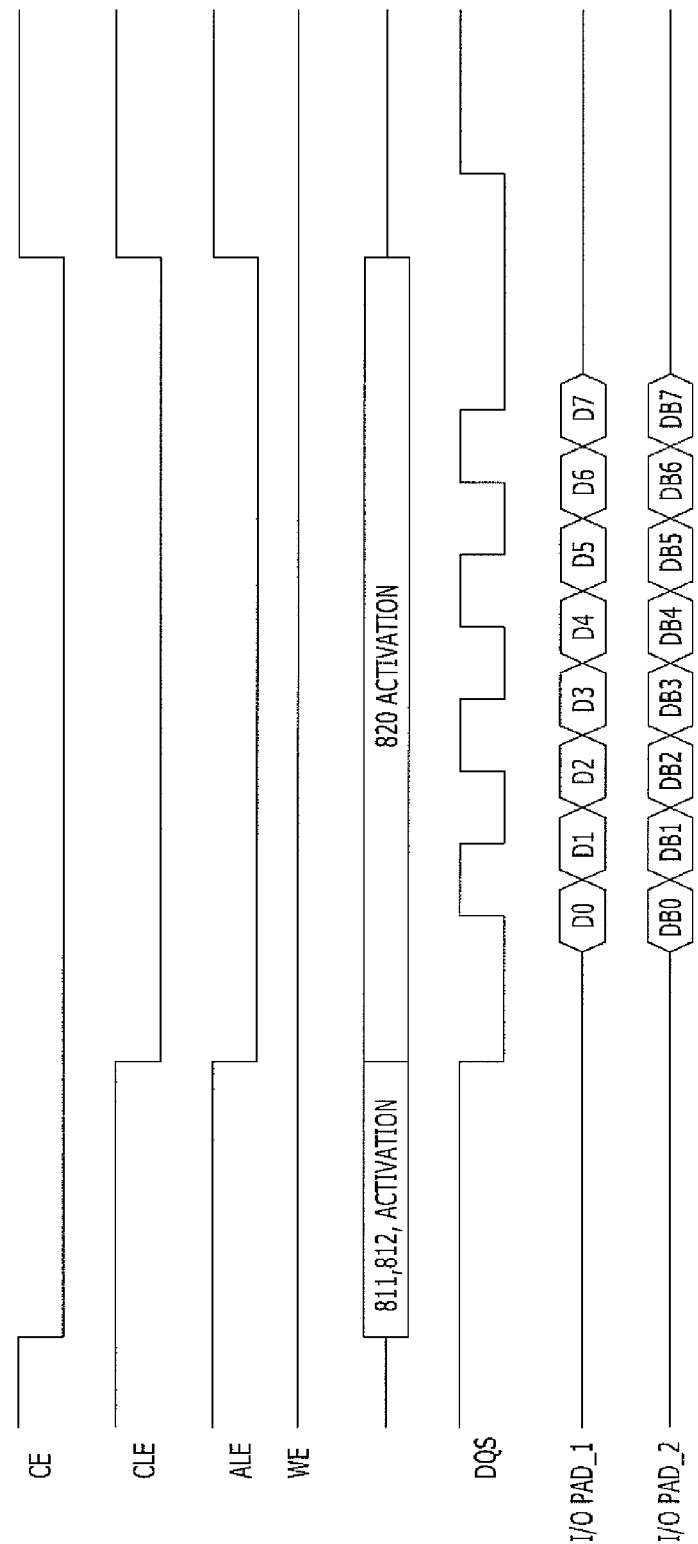

FIGS. 9 to 11 are timing diagrams showing operations of the memory system shown in FIG. 7.

FIG. 9 is a timing diagram showing transfer of commands from the memory controller chip 710 to the memory chip 700. Referring to FIG. 9, if the chip enable signal CE is activated to the low level, the first single ended type buffer 811 and the second single ended type buffer 812 are activated. Further, in the period in which the command latch enable signal CLE is activated to the high level, commands Command1 and Command2 are inputted through the first pad I/O PAD_1 and the second pad I/O PAD_2 in the single ended type. At the time when the commands Command1 and Command2 are applied, a write enable signal WE is activated to a low level. The write enable signal WE is a signal which is used for strobing the commands and addresses inputted through the first pad I/O PAD_1 and the second pad I/O PAD_2. For reference, in the second embodiment of the present invention, since the write enable signal WE is not used for selecting a buffer type to be used, the write enable signal WE is not shown in the preceding drawings associated with the second embodiment described above. If the chip enable signal CE is deactivated to the high level after the commands Command1 and Command2 are completely inputted, the first single ended type buffer 811 and the second single ended type buffer 812 which have been activated are deactivated.

FIG. 10 is a timing diagram showing transfer of addresses from the memory controller chip 710 to the memory chip 700. Referring to FIG. 10, if the chip enable signal CE is activated to the low level, the first single ended type buffer 811 and the second single ended type buffer 812 are activated. Further, in the period in which the address latch enable signal ALE is activated to the high level, addresses Address1 and Address2 are inputted through the first pad I/O PAD_1 and the second pad I/O PAD_2 in the single ended type. At the time when the addresses Address1 and Address2 are applied, the write enable signal WE is activated to the low level. If the chip enable signal CE is deactivated to the high level after the addresses Address1 and Address2 are completely inputted, the first single ended type buffer 811 and the second single ended type buffer 812 which have been activated are deactivated.

Referring to FIGS. 9 and 10, during the periods in which the commands and the addresses are inputted to the memory chip 700, the first single ended type buffer 811 and the second single ended type buffer 812 are activated and receive the signals inputted to the first pad I/O PAD_1 and the second pad I/O PAD_2, respectively.

FIG. 10 is a timing diagram showing transfer of data from the memory controller chip 710 to the memory chip 700. Referring to FIG. 11, if the chip enable signal CE is activated to the low level, the first single ended type buffer 811 and the second single ended type buffer 812 are activated. Further, if both the address latch enable signal ALE and the command latch enable signal CLE are deactivated to low levels, the differential type buffer 820 is activated. With the differential type buffer 820 activated, a data strobe signal DQS toggles, and data D0 to D7 and DB0 to DB7 are inputted through the first pad I/O PAD_1 and the second pad I/O PAD_2 in the differential type in synchronization with the data strobe signal DQS. It may be seen in FIG. 11 that main data D0 to D7 are inputted to the first pad I/O PAD_1 and sub data DB0 to DB7 obtained by inverting the main data D0 to D7 are inputted to the second pad I/O PAD_2. If the chip enable signal CE is deactivated to the high level after the data D0 to D7 and DB0 to DB7 are completely inputted, the differential type buffer 820 is deactivated.

Although it is illustrated in FIG. 11 that the first single ended type buffer 811 and the second single ended type buffer 812 are not activated until the chip enable signal CE is deactivated after the data D0 to D7 and DB0 to DB7 are completely inputted, they may be activated if the logic values of the address latch enable signal ALE and the command latch enable signal CLE change, that is, at least one signal of the two signals ALE and CLE is activated, even before the chip enable signal CE is deactivated.

Third Embodiment

Protocol Conversion According to Setting

Figure 12:
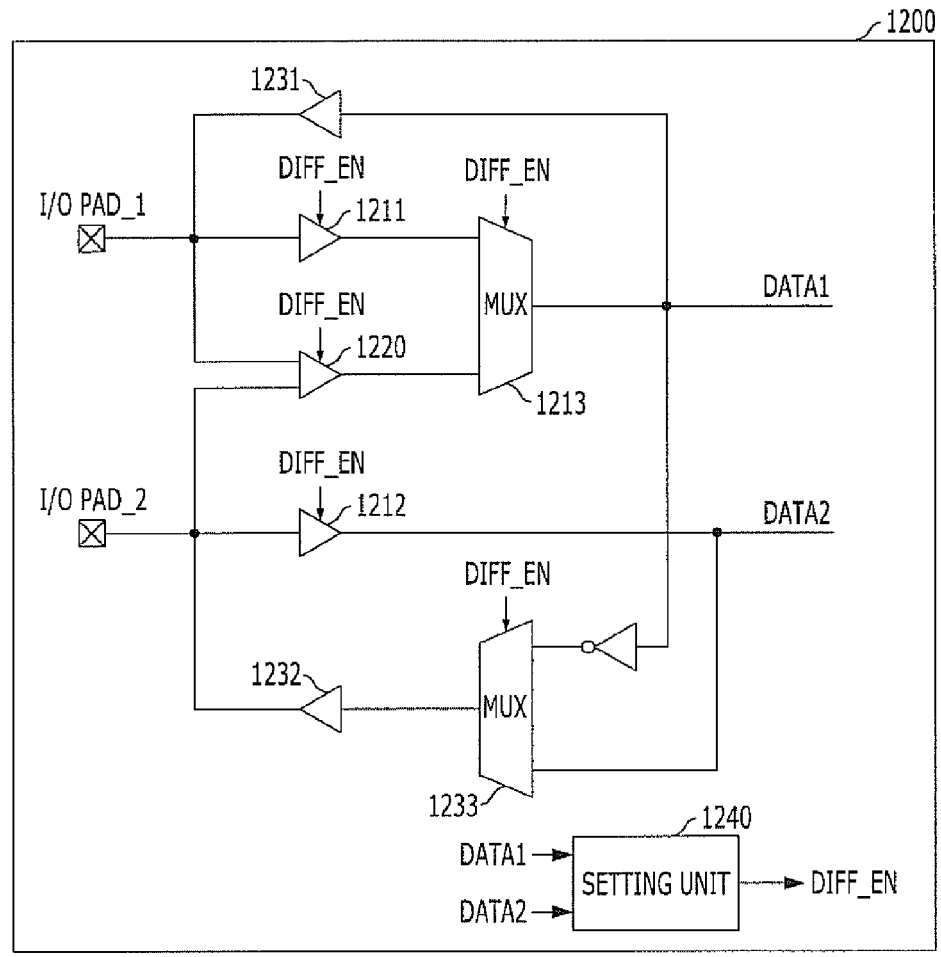
FIG. 12 is a configuration diagram of an integrated circuit chip in accordance with a third embodiment of the present invention.

FIG. 12 is a configuration diagram of an integrated circuit chip in accordance with a third embodiment of the present invention.

Referring to FIG. 12, an integrated circuit chip 1200 includes a first pad I/O PAD_1, a second pad I/O PAD_2, a first single ended type buffer 1211, a second single ended type buffer 1212, a differential type buffer 1220, a first driver 1231, a second driver 1232, and a setting unit 1240.

The first pad I/O PAD_1 and the second pad I/O PAD_2 are pads through which signals are inputted from or outputted to an outside of the integrated circuit chip 1200. The signals are inputted and outputted through the first pad I/O PAD_1 and the second pad I/O PAD_2 in a single ended type or in a differential type.

The first single ended type buffer 1211 is connected to the first pad I/O PAD_1 and receives in the single ended type the signal inputted through the first pad I/O PAD_1. The second single ended type buffer 1212 is connected to the second pad I/O PAD_2 and receives in the single ended type the signal inputted to the second pad I/O PAD_2. The first single ended type buffer 1211 and the second single ended type buffer 1212 are activated and deactivated in response to a select signal DIFF_EN. In detail, when the select signal DIFF_EN has a low level, the first single ended type buffer 1211 and the second single ended type buffer 1212 are activated, and, when the select signal DIFF_EN has a high level, the first single ended type buffer 1211 and the second single ended type buffer 1212 are deactivated.

The differential type buffer 1220 is connected to the first pad I/O PAD_1 and the second pad I/O PAD_2 and receives in the differential type the signals inputted to the first pad I/O PAD_1 and the second pad I/O PAD_2. If the differential type buffer 1220 is activated, a main signal is inputted to the first pad I/O PAD_1, and a sub signal (a signal obtained by inverting the main signal) is inputted to the second pad I/O PAD_2. The differential type buffer 1220 is activated and deactivated in response to the select signal DIFF_EN. In detail, when the select signal DIFF_EN has the high level, the differential type buffer 1220 is activated, and, when the select signal DIFF_EN has the low level, the differential type buffer 1220 is deactivated.

A selection unit 1213 is configured to transfer the signal inputted through the differential type buffer 1220 to an internal circuit while the differential type buffer 1220 is activated and transfer the signal inputted through the first single ended type buffer 1211 to the internal circuit while the first single ended type buffer 1211 is activated.

The first driver 1231 is connected to the first pad I/O PAD_1 and outputs data to the first pad I/O PAD_1. The second driver 1232 is connected to the second pad I/O PAD_2 and outputs data to the second pad I/O PAD_2. The first driver 1231 and the second driver 1232 respectively output separate signals DATA1 and DATA2 in the single ended type, or the first driver 1231 outputs a main signal DATA1 and the second driver 1232 outputs a sub signal DATA1B in the differential type.

A type in which signals are to be outputted through the first driver 1231 and the second driver 1232 is determined by the select signal DIFF_EN. When the select signal DIFF_EN is activated to the high level, a selection unit 1233 allows the sub signal DATA1B obtained by inverting the main signal DATA1 to be outputted through the second driver 1232, and, when the select signal DIFF_EN is deactivated to the low level, the selection unit 1233 allows the signal DATA2 to be outputted through the second driver 1232. That is to say, when the select signal DIFF_EN is activated to the high level, the signals DATA1 and DATA1B are outputted through the first driver 1231 and the second driver 1232 in the differential type, and, when the select signal DIFF_EN is deactivated to the low level, the separate signals DATA1 and DATA2 are outputted through the first driver 1231 and the second driver 1232 in the single ended type.

The setting unit 1240 is configured to set an operation mode using the signals inputted through the first pad I/O PAD_1 and the second pad I/O PAD_2 (the number of signals to be used for setting by the setting unit 1240 may be changed depending upon circuit design purposes). Here, the setting of an operation mode means that a mode in which signals are to be inputted to the first pad I/O PAD_1 and the second pad I/O PAD_2 in the differential type or a mode in which signals are to be inputted to the first pad I/O PAD_1 and the second pad I/O PAD_2 in the single ended type is set. The setting of an operation mode may be implemented in an initial operation of the integrated circuit chip 1200. If an operation mode is set to a differential mode as a result of decoding signals by the setting unit 1240, the select signal DIFF_EN becomes the high level. Accordingly, when the differential mode is set, the differential type buffer 1220 is used to be inputted with the signals of the first pad I/O PAD_1 and the second pad I/O PAD_2, and signals are outputted through the first pad I/O PAD_1 and the second pad I/O PAD_2 in the differential type. Also, if an operation mode is set to a single ended mode as a result of decoding signals by the setting unit 1240, the select signal DIFF_EN becomes the low level. Accordingly, when the single ended mode is set, the first single ended type buffer 1211 and the second single ended type buffer 1212 are used to be inputted with the signals of the first pad I/O PAD_1 and the second pad I/O PAD_2, and signals are outputted through the first pad I/O PAD_1 and the second pad I/O PAD_2 in the single ended type.

Before the setting unit 1240 decodes the signals inputted through the first pad I/O PAD_1 and the second pad I/O PAD_2, the select signal DIFF_EN has a given initial value. For example, before the setting unit 1240 decodes the signals and sets an operation mode, the select signal DIFF_EN may have an initial value of a low level. The reason why the select signal DIFF_EN has the given initial value resides in that one kind (type) among the first single ended type buffer 1211, the second single ended type buffer 1212 and the differential type buffer 1220 is to be in an activated state since the setting unit 1240 set an operation mode using the signals inputted through the first pad I/O PAD_1 and the second pad I/O PAD_2.

In this third embodiment of the present invention, if an operation mode is set to the differential mode, signals are inputted and outputted through the first pad I/O PAD_1 and the second pad I/O PAD_2 in the differential type, and, if an operation mode is set to the single ended mode, signals are inputted and outputted through the first pad I/O PAD_1 and the second pad I/O PAD_2 in the single ended type. Therefore, a signal input and output type may be flexibly changed depending on the specification of a system to which the integrated circuit chip 1200 is applied.

Figure 13:
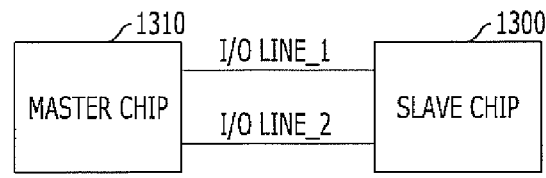
FIG. 13 is a diagram showing a system including the integrated circuit chip in accordance with the third embodiment of the present invention as a slave chip and a master chip for controlling the same.

FIG. 13 is a diagram showing a system including the integrated circuit chip in accordance with the third embodiment of the present invention as a slave chip a master chip for controlling the same.

Referring to FIG. 13, a system includes a master chip 1310, a slave chip 1300, and I/O lines I/O LINE_1 and I/O LINE_2 between the master chip 1300 and the slave chip 1200.

The master chip 1310 is a chip which sets the operation mode of the slave chip 1300 and controls the operation of the slave chip 1300. The slave chip 1300 is a chip which operates under the control of the master chip 1310. For example, the master chip 1310 may be a memory controller chip, and the slave chip 1300 may be a memory chip. The integrated circuit chip 1200 of FIG. 12 corresponds to the slave chip 1300 of FIG. 13.

The I/O lines I/O LINE_1 and I/O LINE_2 are lines through which signals are transferred between the master chip 1310 and the slave chip 1300. As described above with reference to FIG. 12, the first single ended type buffer 1211, the second single ended type buffer 1212 and the differential type buffer 1220 for receiving the signals of the I/O lines I/O LINE_1 and I/O LINE_2 are provided in the slave chip 1300, and the slave chip 1300 receives the signals from the I/O lines I/O LINE_1 and I/O LINE_2 in the single ended type or the differential type depending on the setting of an operation mode. Further, the first driver 1231 and the second driver 1232 for outputting signals to the I/O lines I/O LINE_1 and I/O LINE_2 are provided in the slave chip 1300, and the slave chip 1300 output signals to the I/O lines I/O LINE_1 and I/O LINE_2 in the single ended type or the differential type depending on the setting of an operation mode.

Figure 14:
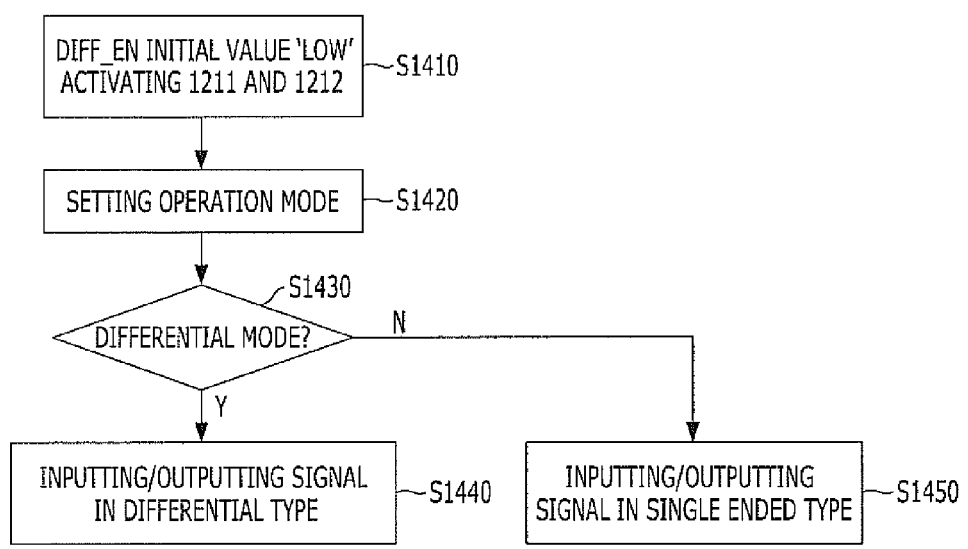
FIG. 14 is a flow chart showing operations of the system shown in FIG. 13.

FIG. 14 is a flow chart showing operations of the system shown in FIG. 13.

Referring to FIG. 14, first, since the select signal DIFF_EN has the low level as the initial value, the first single ended type buffer 1211 and the second single ended type buffer 1212 in the slave chip 1300 are activated (S1410).

Signals for setting an operation mode are inputted from the master chip 1310 to the slave chip 1300 through the I/O lines I/O LINE_1 and I/O LINE_2, and an operation mode is set by the setting unit 1240 in the slave chip 1300 (S1420).

In the case that an operation mode is set as the differential mode (Y in S1430), the select signal DIFF_EN becomes the high level. Accordingly, the slave chip 1300 exchanges signals with the master chip 1310 in the differential type (S1440).

In the case that an operation mode is set as the single ended mode (N in S1430), the select signal DIFF_EN becomes the low level. Accordingly, the slave chip 1300 exchanges signals with the master chip 1310 in the single ended type (S1450).

In this way, in the third embodiment of the present invention, the slave chip 1300 receives or outputs signals in the differential type or in the single ended type depending on operation mode setting thereof.

As apparent from the above descriptions, in the case that data are to be transmitted and received at a high speed, the data are transmitted and received in a differential type to minimize influences by noise, and in the case that data are to be transmitted and received at a low speed, the data are transmitted and received in a single ended type to increase the number of channels and reduce current consumption.

While the present invention has been described with respect to the specific embodiments, it will be apparent to those skilled in the art that various changes and modifications may be made without departing from the spirit and scope of the invention as defined in the following claims.

What is claimed is:

1. An integrated circuit chip comprising:
    a first single ended type buffer configured to receive a first signal through a first pad;
    a second single ended type buffer configured to receive a second signal through a second pad;
    a differential type buffer configured to receive a third signal through the first pad and the second pad;
    a strobe input unit configured to receive a strobe signal synchronized with the third signal inputted to the first pad and the second pad; and
    a buffer control unit configured to control activation of the first and second single ended type buffers and the differential type buffer in response to the strobe signal,
    wherein the third signal includes a signal and an inverted signal of the signal inputted to the first and second pads, respectively,
    wherein the strobe signal pulses, when the third signal is inputted to the first pad and the second pad, and has preamble and postamble periods before and after a pulsing period, respectively, and
    wherein the buffer control unit activates the differential type buffer in response to the preamble period of the strobe signal and deactivates the differential type buffer in response to the postamble period of the strobe signal.

2. The integrated circuit chip of claim 1,
    wherein the buffer control unit deactivates the first and second single ended type buffers when the differential type buffer is activated, and
    wherein the buffer control unit activates the first and second single ended type buffers when the differential type buffer is deactivated.

3. The integrated circuit chip of claim 1, wherein the buffer control unit comprises:
    an amble sensing section configured to sense the preamble period and the postamble period of the strobe signal; and
    an on/off control section configured to activate an on/off signal when the amble sensing section senses the preamble period and deactivate the on/off signal when the amble sensing section senses the postamble period.

4. The integrated circuit chip of claim 1, further comprising:
    a first driver configured to output first high and low speed signals through the first pad;
    a second driver configured to output second high and low speed signals through the second pad;
    a strobe generation unit configured to generate an output strobe signal in synchronization with the first and second high speed signals to be outputted to the first pad and the second pad;
    a strobe output unit configured to output the output strobe signal; and
    a driver control unit configured to control the first driver and the second driver to output the first and second high speed signals in a differential type or the first and second low speed signals in a single ended type.

5. An integrated circuit chip comprising:
    a first driver configured to output first high and low speed signals through a first pad;
    a second driver configured to output second high and low speed signals through a second pad;
    a strobe generation unit configured to generate a strobe signal in synchronization with the first and second high speed signals to be outputted to the first pad and the second pad;
    a strobe output unit configured to output the strobe signal; and
    a driver control unit configured to control the first driver and the second driver to output the first and second high speed signals in a differential type or the first and second low speed signals in a single ended type,
    wherein the strobe signal pulses, when the first and second high speed signals are outputted to the first pad and the second pad, and has preamble and postamble periods before and after a pulsing period, respectively, and
    wherein the driver control unit controls the first and second high speed signals to be outputted to the first driver and the second driver in the differential type from the preamble period to the postamble period of the strobe signal.

6. The integrated circuit chip of claim 5, wherein the driver control unit controls the first and second low speed signals to be outputted to the first driver and the second driver in the single ended type except a period from the preamble period to the postamble period of the strobe signal.

7. An integrated circuit chip comprising:
    a first single ended type buffer configured to receive a first signal through a first pad;
    a second single ended type buffer configured to receive a second signal through a second pad;
    a differential type buffer configured to receive a third signal through the first pad and the second pad;
    a status signal input unit configured to receive at least one status signal indicating which ones of the first to third signals are inputted to the first pad and the second pad; and
    a buffer control unit configured to activate the differential type buffer or the first and second single ended type buffers in response to the status signal,
    wherein the integrated circuit chip comprises a nonvolatile memory,
    wherein the status signal includes a command latch enable signal and an address latch enable signal, and
    wherein the buffer control unit activates the differential type buffer when both the command latch enable signal and the address latch enable signal are deactivated, otherwise activates the first and second single ended type buffers.

8. The integrated circuit chip of claim 7, further comprising:
   a chip enable input unit configured to receive a chip enable signal,
   wherein the buffer control unit deactivates all the differential type buffer and the first and second single ended type buffers when the chip enable signal is deactivated.

9. An integrated circuit chip comprising:
   a first pad;
   a second pad;
   a first single ended type buffer connected to the first pad;
   a second single ended type buffer connected to the second pad; and
   a differential type buffer connected to the first pad and the second pad,
   wherein one type of buffer between the differential type buffer and the first and second single ended type buffers is activated in response to an operation mode set by an external input,
   wherein the operation mode is set in an initial operation of the integrated circuit chip, and
   wherein, before the operation mode is set, a set buffer between the differential type buffer and the first and second single ended type buffers is activated.

10. The integrated circuit chip of claim 9, further comprising:
    a setting unit configured to set the operation mode using a signal inputted through the set buffer.

11. The integrated circuit chip of claim 9, further comprising:
    a first driver connected to the first pad; and
    a second driver connected to the second pad,
    wherein the first driver and the second driver are controlled to output data in a differential type or in a single ended type in response to the operation mode.

* * * * *